United States Patent
Aakjer (10) Patent No.: US 7,023,750 B2
(45) Date of Patent: Apr. 4, 2006

(54) DYNAMICAL BIASING OF MEMORY SENSE AMPLIFIERS

(75) Inventor: Thomas Aakjer, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 31 days.

(21) Appl. No.: 10/898,478

(22) Filed: Jul. 23, 2004

(65) Prior Publication Data

US 2006/0018169 A1    Jan. 26, 2006

(30) Foreign Application Priority Data

Jul. 21, 2004  (EP)  .................... 04368053

(51) Int. Cl.
*G11C 7/00*     (2006.01)
(52) U.S. Cl. .................... 365/205; 365/233; 365/233.5
(58) Field of Classification Search .................... None
See application file for complete search history.

(56) References Cited

U.S. PATENT DOCUMENTS

| | | | |
|---|---|---|---|
| 4,780,850 A | 10/1988 | Miyamoto et al. | 365/189 |
| 5,323,360 A * | 6/1994 | Pelley, III | 365/233.5 |
| 6,061,297 A | 5/2000 | Suzuki | 365/238.5 |
| 6,118,439 A | 9/2000 | Ho et al. | 345/211 |
| 6,624,669 B1 | 9/2003 | Tsuchi | 327/108 |
| 6,671,199 B1 | 12/2003 | Maruyama | 365/145 |

FOREIGN PATENT DOCUMENTS

GB       2314951 A       1/1998

OTHER PUBLICATIONS

U.S. Patent 5,133,373 (from the Patent Family of European Patent 0 470 719 A) to Lee, Pub. Date May 12, 1992, filed Aug. 6, 1990.

* cited by examiner

*Primary Examiner*—David Lam
(74) *Attorney, Agent, or Firm*—George O. Saile; Stephen B. Ackerman (57) ABSTRACT

A circuit and a method are given, to realize a dynamical biasing of memory sense amplifiers for Sense Electronics Endowed (SEE) memory devices. Fast memories uses sense amplifiers in the read path in order to react fast with the data being delivered from a given address position. In order to achieve short response times, these sense amplifiers are normally supplied with a high bias current. Dynamically reducing the bias current after a certain "on" time of operation will save power for fast memories used in conditions where the utmost speed is not needed. Said circuit and method are designed in order to be implemented with a very economic number of components, capable to be realized with modern integrated circuit technologies.

34 Claims, 6 Drawing Sheets

DYNAMICAL BIASING OF MEMORY SENSE AMPLIFIERS

BACKGROUND OF THE INVENTION (1) Field of the Invention

The invention relates generally to data storage in semiconductor memory devices and more particularly, to memory devices equipped with sense amplifiers or additional read-out electronics such as Read Only Memory ROM, Flash memory, Random Access Memory (RAM), and also Magnetic RAM (MRAM) or even Ferroelectric RAM (FRAM). These memories are subsumed for brevity under the designation of Sense Electronics Endowed (SEE) memories. Even more particularly this invention is relating to SEE-memory devices with reduced power consumption by dynamical biasing of sense amplifiers during a low-power mode operation of such SEE-memory devices.

(2) Description of the Prior Art

Microprocessor systems can be found nowadays working in many devices, such as Personal Computers (PCs) especially modern portable notebook computers, in Personal Data Assistants (PDAs), mobile phones, navigation systems—mostly also used as portable devices, but also in many household appliances, in automobiles etc. and they all have Central Processing Units (CPUs) which need some sort of Random Access Memory (RAM) for their primary workspace (in RAM the code and data for the CPU are stored) usually implemented as semiconductor memory, wherein the contents of each byte can be directly and randomly accessed. Other types of memory chips, including ROMs and PROMs have this property as well, but only RAM chips are economically priced however they require power to maintain their content. The most common type of computer memory in current solid-state memory technology for main memory storage, which usually uses one transistor and a storage capacitor to represent a bit, is called Dynamic RAM (DRAM). Therein the capacitors must be energized hundreds of times per second in order to maintain the charges, representing the stored information as data. A data bus system is used for moving the information in and out of the RAM storage and an address bus addresses the storage location of the information data within the RAM. The RAM is usually organized in a grid or matrix configuration, where each bit is stored in its own data cell and each row and column has its own address. Another implementation called Static RAM (SRAM) is a type of RAM that holds data without need to refresh the stored content. An SRAM bit is made up of 4 to 8 transistors and is therefore very fast, with access times in the 10 to 30-nanosecond range but also power dissipating and expensive to produce. In comparison, DRAM only uses one transistor per memory cell and has access times, which are usually above 30 ns. SRAM does not require any refreshing operation and is easily handled, but is more expensive than DRAM and has a smaller capacity than DRAM comparing the same chip area. Because of these properties, SRAM is used to create a CPU's speed-sensitive cache, while DRAM is used for the larger system main storage RAM space. The memory internal operations during read, write, and refresh transactions are governed by a number of control signals allowing to strobe or clock addresses and data in and out, and to partially select, enable or inhibit these operations. All these operations are more or less power consuming, which leads especially with portable systems to reduced power-on times, as these systems are dependent from the energy capacity stored in their battery. These considerations hold especially for systems incorporating memory devices equipped with sense amplifiers or additional read-out electronics such as Read Only Memory ROM, Flash memory, Random Access Memory (RAM), and also Magnetic RAM (MRAM) or even Ferroelectric RAM (FRAM). These memories will in the following altogether be subsumed for brevity under the designation of Sense Electronics Endowed (SEE) memories. It is therefore important to reduce power consumption during operation of these systems, and especially the power consumption of the SEE-memory devices.

In the prior art, there are different technical approaches for achieving the goal of a reduction of power consumption. However these approaches use often solutions, which are somewhat technically complex and therefore also expensive in production. It would be advantageous to reduce the expenses in both areas. This is achieved by using a dynamical biasing of sense amplifiers during a low-power mode operation, when not in full service. Using the intrinsic advantages of that solution—as described later on in every detail—the circuit of the invention is realized with standard CMOS technology at low cost.

Preferred prior art realizations are implementing such related memory circuits in single chip or multiple chip solutions as integrated circuits. The permanent high power requirement and therefore high system costs are the main disadvantages of these prior art solutions. It is therefore a challenge for the designer of such devices and circuits to achieve a high-quality but also low-cost solution.

Several prior art inventions referring to such solutions describe related methods, devices and circuits, and there are also several such solutions available with various patents referring to comparable approaches, out of which some are listed in the following:

U.S. Pat. No. 6,118,439 (to Ho et al.) describes a low current voltage supply circuit for an LCD driver wherein a voltage supply circuit for an LCD driver employs two voltage dividers. A low current voltage divider includes resistive elements having a high resistance, thus providing a bias voltage with a low current. A high current voltage divider includes resistive elements having low resistances, thus providing a bias voltage with a high current. The high current voltage divider provides bias voltage levels with high current at the beginning of each time phase change. Thus, the liquid crystal display receives a high current when updating the bias voltage levels on the LCD, thereby producing a fast settling time. When the bias voltage levels are held constant, however, only the low current voltage divider provides the bias voltage levels to reduce power consumption. A halt mode prevents the liquid crystal display and driver from consuming any power by disconnecting both voltage dividers from the voltage source when in sleep mode. A voltage drop mode produces a reduction in the bias voltage levels by placing another voltage drop in series with the voltage dividers.

U.S. Pat. No. 6,624,669 (to Tsuchi) discloses a drive circuit and drive circuit system for capacitive load whereby said drive circuit includes a first field effect transistor having a source connected to an input terminal and a drain and a gate connected in common, a second field effect transistor having a drain to a first power supply terminal, a source connected to an output terminal and a gate connected to the gate of the first transistor, a first current control circuit connected between the first power supply terminal and the drain of the first transistor, a second current control circuit connected between the input terminal and a second power supply terminal, and a third current control circuit connected between the output terminal and the second power supply terminal. Accordingly, the gate of the second transistor is biased with a voltage that is deviated from an input voltage by a gate-source voltage of the first transistor, so that the second transistor operates in a source-follower fashion without oscillation. Thus, the drive circuit can be constructed without including a capacitor, and therefore, a required circuit area can be reduced.

U.S. Pat. No. 6,671,199 (to Maruyama) shows a data storage method for semiconductor integrated circuit, semiconductor integrated circuit, semiconductor device equipped with many of the semiconductor integrated circuits, and electronic apparatus using the semiconductor device whereby in said data storage method for memory cells that compose a semiconductor integrated circuit, a power supply potential VDD or a potential VL that is lowered from the power supply potential VDD by a threshold potential of Nch transistors is applied for each of the directions of the voltages that are applied to a ferroelectric capacitor in response to data to thereby perform writing. In the present invention, a semiconductor device equipped with a plurality of semiconductor integrated circuits described above is applied to FeRAMs or DRAMs, and the semiconductor device is used in a hand-carry type data terminal, a telephone and the like.

Figure 1:
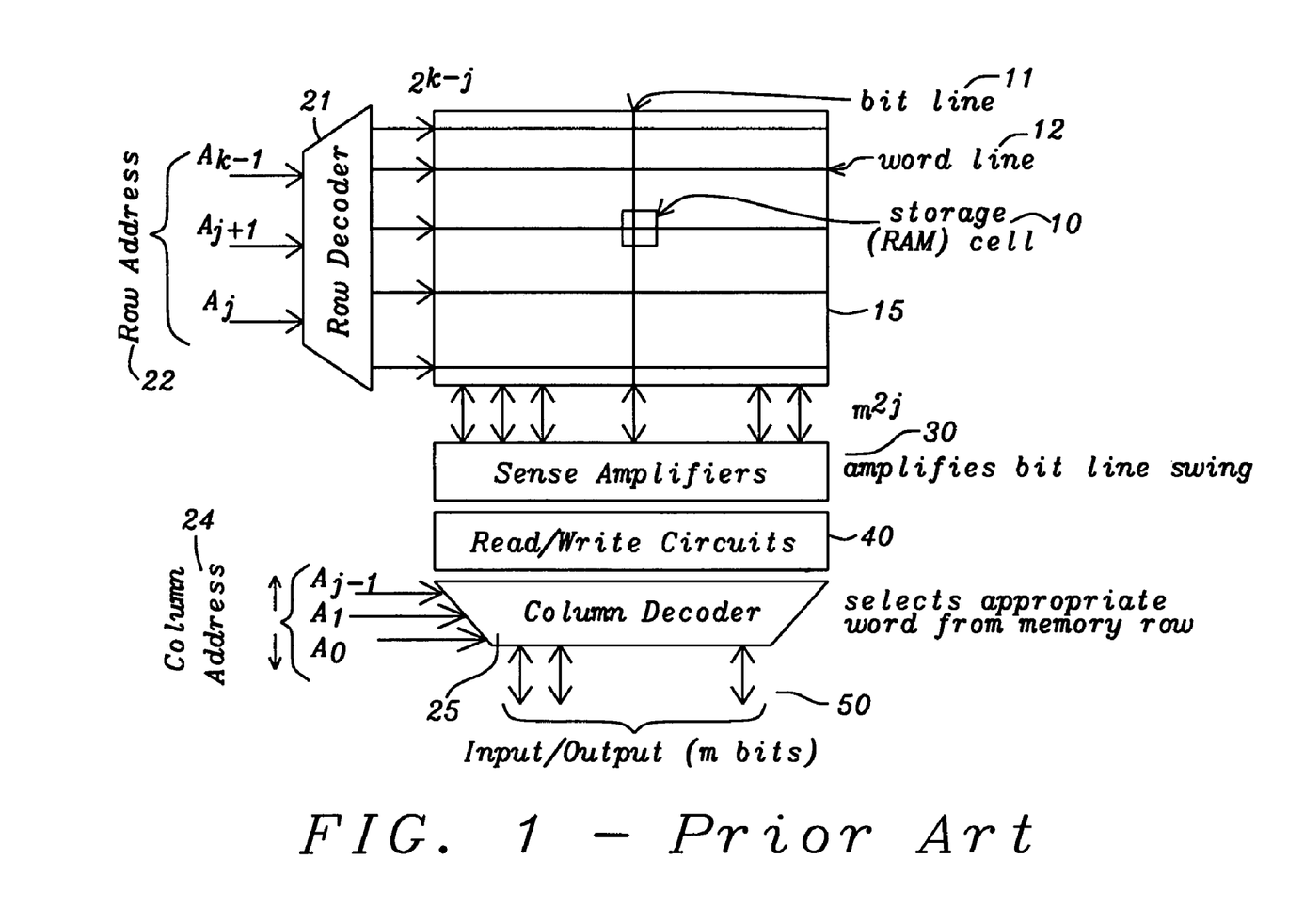
FIG. 1 prior art shows the basic RAM circuit in form of a modified circuit diagram (i.e. with a graphical representation of the memory array as grid or matrix layout).

The basic RAM circuit is shown in FIG. 1 prior art in form of a modified circuit diagram (i.e. with graphical representation of the memory array as grid layout) with a storage (RAM) cell 10 as central component, wherein the information is stored as a single bit, in this case. Arranging these data storage cells 10 in form of a rectangular grid unfolds the core bit/word (X/Y) organized memory array element, with horizontal rows 12 and vertical columns 11 spanning a storage matrix 15 with Cartesian X and Y coordinates identifying the X/Y data cell location 10 and in such a way setting up the main storage area organized in bits (X) and words (Y). In technical terms the columns are designed as bit lines 11 and the rows as word lines 12, the storage (RAM) cells 10 can be implemented as single transistor-capacitor DRAM or multiple transistor SRAM cells, or even as formerly used magnetic cores or MRAM (Magnetic RAM) devices of late. This memory array is now addressed through the address bus system from the processor CPU with addresses made up of a Row Address 22 part and a Column Address 24 part, the Row Address 22 part being decoded in a Row Decoder 21 and the Column Address 24 part being decoded in the address part of a Column Decoder 25. The Row Decoder 21 is then activating the according word line 12, whereas the address part of the Column Decoder 25 activates the according bit line 11. Depending on the operation to be performed a Write, Read or Refresh cycle for the selected storage (RAM) cell 10 is then executed. Therefore Read/Write Circuits 40 are activated, performing the according bitwise data operations with the help of Sense Amplifiers 30 and acting on the particular storage (RAM) cells 10. The relevant data are delivered via said Column Decoder 25 too, having additionally a data part, connected to the Input/Output data bus system of the CPU. These data are therefore written into or read from the main memory array in parallel with the help of said Column Decoder 25 connected to said Read/Write Circuits 40 and these further connected on their part to said Sense Amplifiers 30 writing or reading the contents of the connected storage (RAM) cells 10. Refresh operations are essentially made up of a combination of Read/Write operations. The length of the address as shown in the figure is k bits and depends on the size of the addressable memory—defining also the bus width of the address bus, and the length of the data word as shown in the figure is M bits and depends on the CPU type—determining also the bus width of the data I/O bus.

Although these patents and papers describe circuits and/or methods close to the field of the invention they differ in essential features from the method, the system and especially the circuit introduced here.

SUMMARY OF THE INVENTION

A principal object of the present invention is to realize a circuit for implementing a dynamical biasing of memory sense amplifiers for Sense Electronics Endowed (SEE) memory devices in form of very manufacturable integrated circuits at low cost.

Another principal object of the present invention is to provide an effective and very manufacturable method for implementing a circuit for dynamical biasing of memory sense amplifiers for SEE-memory devices.

Another further object of the present invention is to attain a power loss reduction by dynamical biasing of memory sense amplifiers for SEE-memory devices.

Another still further object of the present invention is to reach an extended power-on time for battery operated microprocessor systems containing devices.

Further another object of the present invention is to give a method featuring the design of a memory circuit, whereby the bias current for the sense amplifiers of memory devices is reduced during low power mode of a system and said memory is thus only operating at full power and speed for a fixed time after an address change occurred.

A still further object of the present invention is to reduce the power consumption of battery powered devices by putting into effect design features, resulting from said newly introduced dynamical biasing of memory sense amplifiers for SEE-memory devices.

Another further object of the present invention is to reduce the cost of manufacturing by implementing the circuit as a monolithic integrated circuit in low cost CMOS technology.

Also an object of the present invention is to enhance the battery lifetime and at the same time to thereby reach a low-cost realization with modern integrated circuit technologies.

Another still further object of the present invention is to reduce cost by minimizing the chip area by means of effectively minimizing component values.

In accordance with the objects of this invention a new circuit is described, capable of realizing a Sense Electronics Endowed (SEE) memory device with dynamical biasing of memory sense amplifiers, comprising a memory array for realizing an SEE-memory device with dynamical biasing of memory sense amplifiers using a sense amplifier with bias current control facility controlled by a "System Clock" signal and having external Address and Data I/O bus system connections, a sense amplifier with read data input and output as well as a bias current control input, whereby said bias current control input is delivered from a bias regulation unit, a bias regulation unit with address change detect signal input generating a time dependent bias current control output signal, and an address transition detection logic delivering said address change detect signal for said bias regulation unit, whereby said address change detect signal is generated from an address being altered on said external Address bus system, then causing the reading of memory data from a memory address location as addressed via said Address bus system with a fully biased memory sense amplifier and finally putting said memory data on said external data I/O bus, whereas said memory sense amplifier is normally biased in order to reduce said bias current according to a dynamical bias current control scheme established within said bias regulation unit until the next address change detect signal is furnished by said address transition detection logic and said dynamical bias current control scheme for application within a read cycle operation governed by said "System Clock" signal; the dynamical bias current control scheme being generated so, that the bias current is controlled by said address change detect signal and defined in a time dependent manner reducing after a certain time said bias current.

Also in accordance with the objects of this invention a new method is described, capable of implementing a Sense Electronics Endowed (SEE) memory device with dynamical biasing of memory sense amplifiers, comprising especially, providing a memory array for realizing an SEE-memory device with dynamical biasing of memory sense amplifiers using a sense amplifier with bias current control facility controlled by a "System Clock" signal and having external Address and Data I/O bus system connections, then also providing said sense amplifier with read data input and output as well as a bias current control input, whereby said bias current control input is delivered from a bias regulation unit, further providing said bias regulation unit with address change detect signal input generating a time dependent bias current control output signal, also providing an address transition detection logic delivering said address change detect signal for said bias regulation unit, generating a dynamical bias current control scheme for application within a read cycle operation governed by said "System Clock" signal, whereby said bias current is controlled by said address change detect signal and defined in a time dependent manner in such a way, that after a certain time said bias current is reduced, detecting within said address transition logic said address change detect signal from an address being altered on said external Address bus system, then reading memory data from a memory address location as addressed via said Address bus system with a fully biased memory sense amplifier and put said memory data on said external data I/O bus, and biasing said memory sense amplifier in order to reduce said bias current according to said dynamical bias current control scheme established within said bias regulation unit until the next address change detect signal is furnished by said address transition detection logic.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiment discloses a novel circuit for memory sense amplifiers used within Sense Electronics Endowed (SEE) memory semiconductor storage devices. According to the invention said SEE-memory devices are enhanced by applying a dynamical biasing operation. This feature is very useful for modern high-speed memories with their considerable consumption of power in normal operation, whereas the particular need for that elevated power is only necessary during read access. In modern fast memories, the read out path normally contains sense amplifiers, which detect the small changes on the data cell outputs when an address is changed. These small output changes are amplified and make the memory respond with output data very fast. Without the sense amplifiers, the memories would respond with output data much slower as the memory cells would need to charge the internal output data bus before the output drivers would react. Dynamically reducing the bias current after a certain "on" time i.e. normally after an already completed read operation, will save power for fast memories used in conditions where the full speed is not needed, or when the memories are kept active longer than actually needed.

Figure 2A:
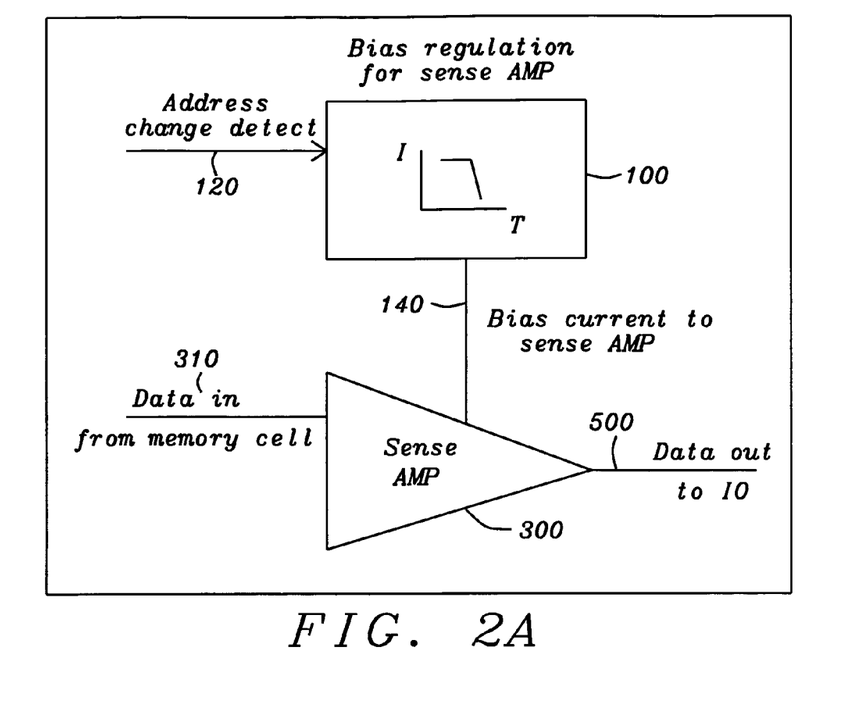
FIG. 2A shows a simplified electrical circuit diagram for the new dynamically biased sense amplifier circuit for Sense Electronics Endowed (SEE) memory devices, enhanced by an additional, address change controlled bias current regulation for said sense amplifier as preferred embodiment of the present invention implementable with a variety of modern monolithic integrated circuit technologies.

Contemplating now FIG. 2A, a simplified circuit diagram of the new circuit for the dynamical biasing of memory sense amplifiers for SEE-memory devices is depicted. Referring to FIG. 1 prior art the position of the Sense Amplifiers 30 is between the memory matrix 15, connected to the bit lines 11 for bit data input, and the Read/Write Circuits 40 finally leading forward to the Data Input/Output 50 bus lines. Coming back now to FIG. 2A this same Sense Amplifier (item 300), named here as Sense AMP reads Data in from memory cell via line 310, amplifying the data just read and feeding them via the amplifier output to the corresponding data output bus lines Data IO 500. Additionally controlled according to the invention by an input signal line 140 furnishing a dynamical bias current to said Sense AMP 300. This dynamical bias current is delivered from said additional element 100, containing the dynamically operating bias regulation 100 of FIG. 2A. Said dynamically operating bias regulation circuit is separately controlled by an address change detect signal via input 120, furnished from a separate standard address transition detection circuit. When the address is changed, the sense amplifier Sense AMP 300 shall be fully biased i.e. receive the full operating current 1. After a certain "on" time T, when the sense amplifier Sense AMP 300 has nearly reached its final value, the bias current can be reduced. When to reduce the bias can either be determined only by a fixed time duration T. A summary of the ways of working for the circuit using dynamically biasing of sense amplifiers can be formulated as such: the sense amplifiers are fully biased in the beginning of a read cycle to make the memories react fast. After this initial "on" time the biasing is lowered until the next address change occurs, because in the meantime no data change needs to be sensed. In other words, when an address change occurs at a memory cell, the bit line input signal of the amplifier reading the memory data is rising from zero voltage and for small values a fast "powerful" sense amplifier is necessary i.e. the amplifier has to be turned fully "on" (small delay times always to be accounted for) and after a certain "on" time—which is depending on the particular memory cell specifications but can be determined as a fixed time—the bit line input signal level has changed to higher values, thus this fast "powerful" sense amplifier is not needed any more, a slower sense amplifier will do now for that situation.

Figure 2B:
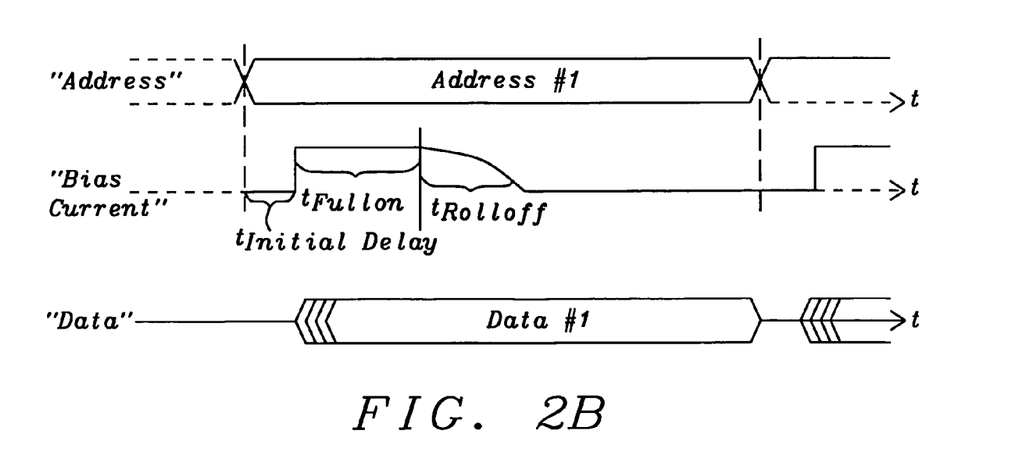
FIG. 2B shows a timing diagram for the three relevant signals "Address", "Bias Current" and "Data" during a read cycle of the new dynamically biased sense amplifier circuit for Sense Electronics Endowed (SEE) memory devices.

FIG. 2B shows a timing diagram for the three relevant signals "Address", "Bias Current" and "Data" during a read cycle for one bit of a data word of the memory, wherein the run of the curve for the "Bias Current" demonstrates after an "Address" signal change and said initial delay time $t_{InitialDelay}$ said full current biasing during $t_{FullOn}$ with the following current reduction during $t_{RollOff}$ as depicted. During such a read cycle all data bits of one data word of the memory are read out in parallel in a similar fashion. These read cycle operations for dynamical biasing of memory sense amplifiers are regularly controlled by clock signals from the embedding microprocessor system and specified in this context as "System Clock" signal.

Figure 3A:
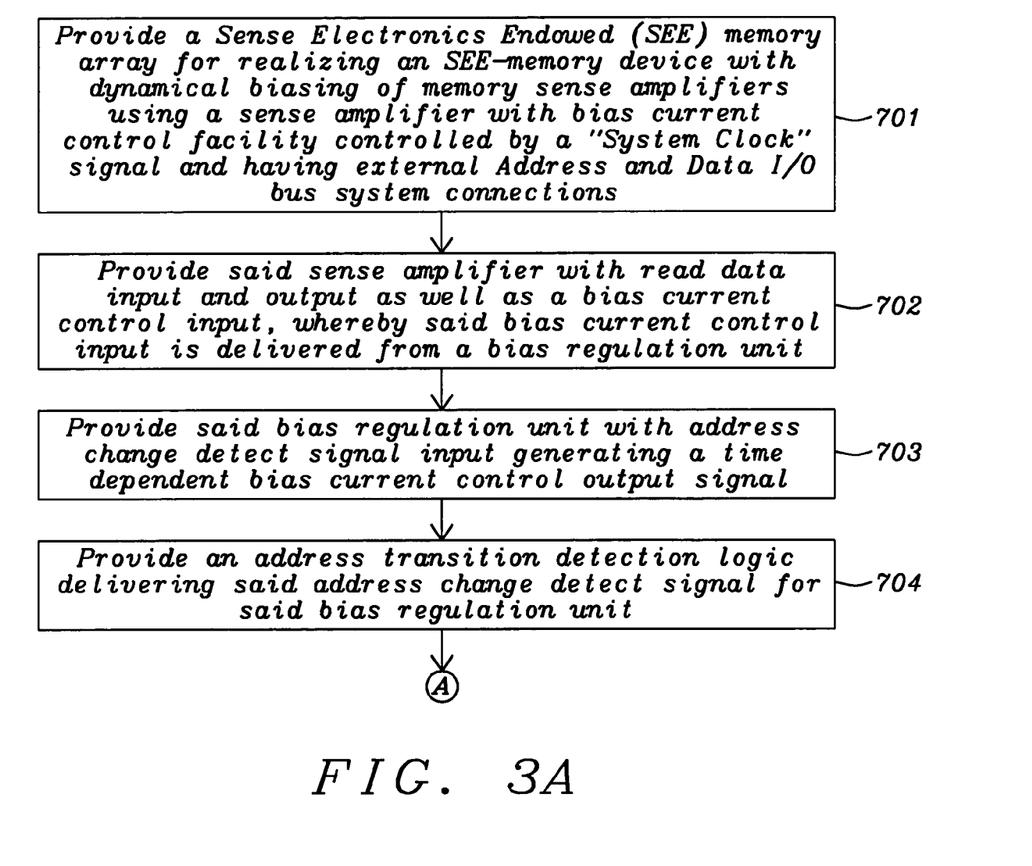
FIGS. 3A & 3B describe with the help of a flow diagram the according method for constructing and operating a circuit for said dynamical biasing of memory sense amplifiers for SEE-memory devices as shown in FIG. 2.
Figure 3B:
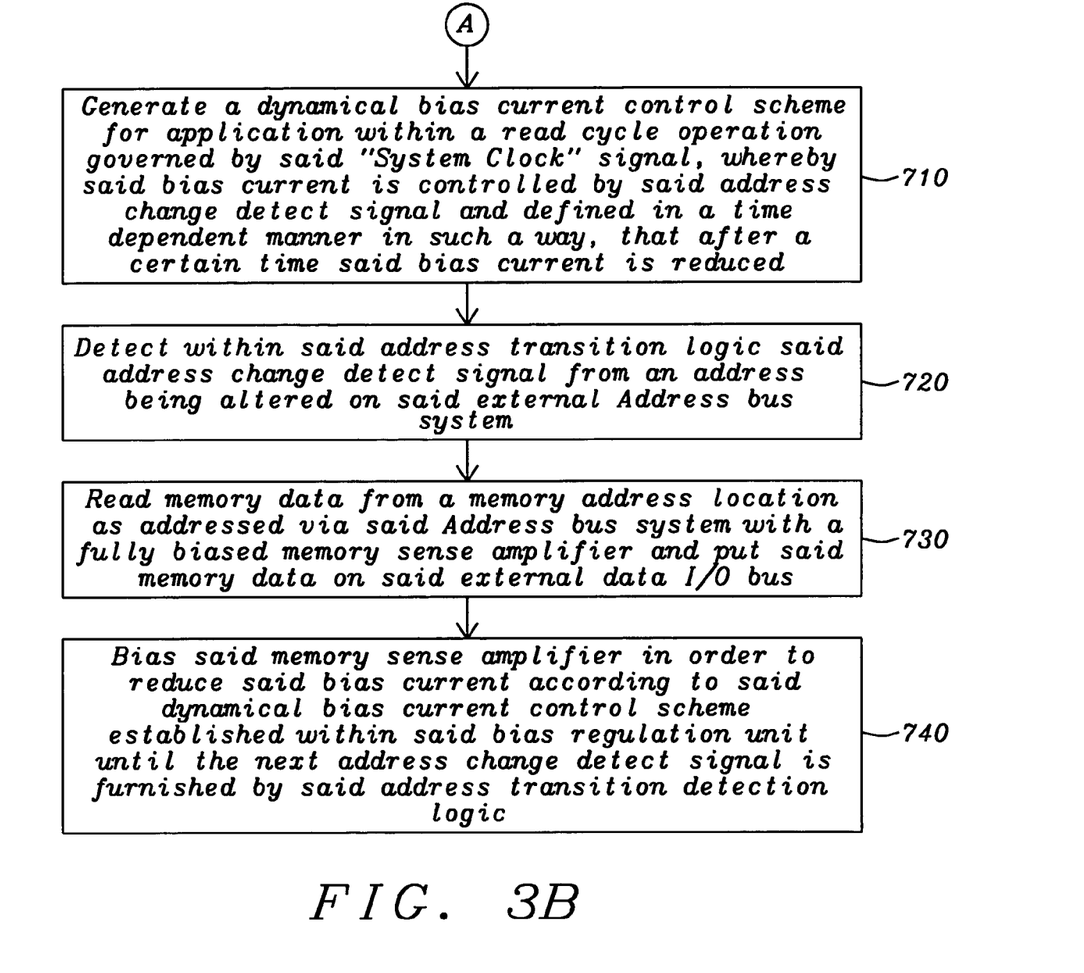

Regarding the flow diagram given in FIGS. 3A & 3B, a method, explaining the operation of the novel circuit for dynamical biasing of memory sense amplifiers for Sense Electronics Endowed (SEE) memory devices according to the invention and exemplified in FIG. 2A is now described and defined by its steps, wherein the first step 701 provides a Random Access Memory (RAM) array using a sense amplifier with bias current control facility controlled by an "System Clock" signal and having external Address and Data I/O bus system connections. Step 702 then provides said sense amplifier with read data input and output as well as bias current control input, whereby said bias current control input is delivered from a bias regulation unit, step 703 provides said bias regulation unit with address change detect signal input generating a time dependent bias current control output signal, and step 704 provides an address transition detection logic delivering said address change detect signal for said bias regulation unit. With step 710 a dynamical bias current control scheme for application within a read cycle operation is generated, governed by said "System Clock" signal, whereby said bias current is controlled by said address change detect signal and defined in a time dependent manner in such a way, that after a certain "on" time said bias current is reduced. Step 720 detects within said address transition logic said address change detect signal from an address being altered on said external Address bus system. Step 730 then reads memory data from a memory address location as addressed via said Address bus system with a fully biased memory sense amplifier and put said memory data on said external data I/O bus. The bias of said memory sense amplifier is set up in step 740 in order to reduce said bias current according to said dynamical bias current control scheme established within said bias regulation unit until the next address change detect signal is furnished by said address transition detection logic.

Figure 4A:
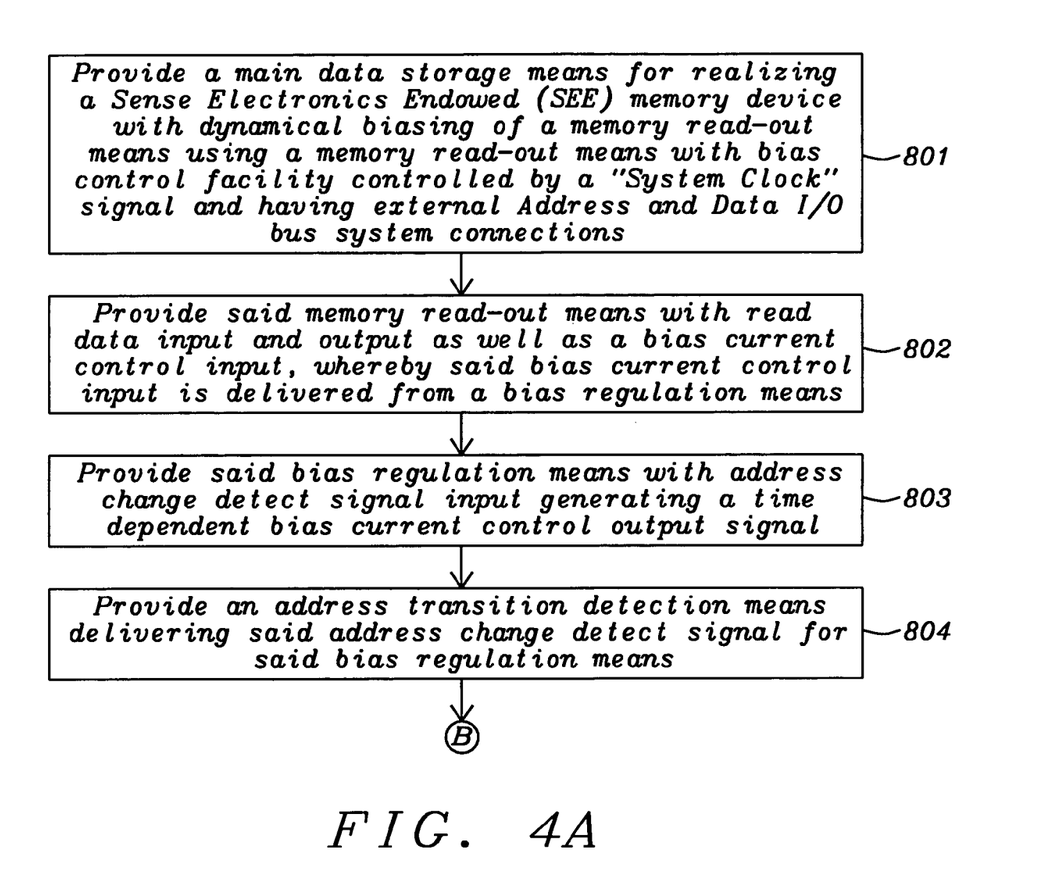
FIGS. 4A & 4B explain with the help of another flow diagram a more general method for constructing and operating a circuit for dynamical biasing of memory sense amplifiers for SEE-memory devices.
Figure 4B:
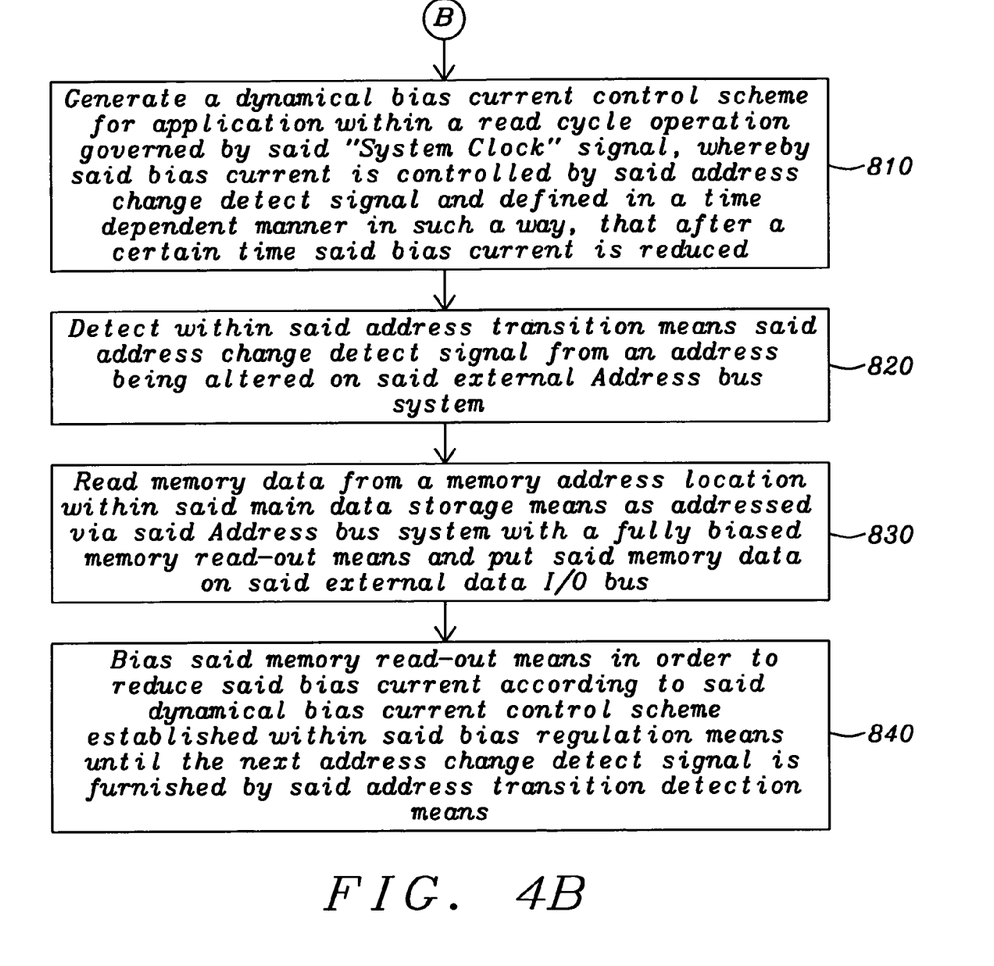

Regarding now the flow diagram given in FIGS. 4A & 4B, a somewhat more general method is now described, explaining the operation of a novel circuit for dynamical biasing of a memory read-out means for a Sense Electronics Endowed (SEE) memory device according to the invention and its steps defined, wherein as first step 801 a main data storage means is provided for realizing an SEE-memory device with dynamical biasing of a memory read-out means using a memory read-out means with bias control facility controlled by an "System Clock" signal and having external Address and Data I/O bus system connections. Steps 802, 803 and 804 provide said memory read-out means with read data input and output as well as a bias current control input, whereby said bias current control input is delivered from a bias regulation means, said bias regulation means with address change detect signal input generating a time dependent bias current control output signal, and an address transition detection means delivering said address change detect signal for said bias regulation means. Step 810 generates a dynamical bias current control scheme for application within a read cycle operation governed by said "System Clock" signal, whereby said bias current is controlled by said address change detect signal and defined in a time dependent manner in such a way, that after a certain "on" time said bias current is reduced. Step 820 detects within said address transition means said address change detect signal from an address being altered on said external Address bus system. Step 830 then reads memory data from a memory address location within said main data storage means as addressed via said Address bus system with a fully biased memory read-out means and put said memory data on said external data I/O bus and finally step 840 sets the bias for said memory read-out means in order to reduce said bias current according to said dynamical bias current control scheme established within said bias regulation means until the next address change detect signal is furnished by said address transition detection means.

Summarizing the essential operational features of the circuit we find, that the circuit of the present invention implements a method, whereby the bias current for the sense amplifiers of memory devices is reduced during low power mode of a system equipped with such memory and thus said memory is only operating at full power and highest speed for a fixed time after an address change occurred.

As shown in the preferred embodiments and evaluated by circuit analysis, the novel system, circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, realizing a Sense Electronics Endowed (SEE) memory device with dynamical biasing of memory sense amplifiers, comprising:

a memory array for realizing an SEE-memory device with dynamical biasing of memory sense amplifiers using a sense amplifier with bias current control facility controlled by a "System Clock" signal and having external Address and Data I/O bus system connections;

a sense amplifier with read data input and output as well as a bias current control input, whereby said bias current control input is delivered from a bias regulation unit;

a bias regulation unit with address change detect signal input generating a time dependent bias current control output signal; and an address transition detection logic delivering said address change detect signal for said bias regulation unit, whereby said address change detect signal is generated from an address being altered on said external Address bus system, then causing the reading of memory data from a memory address location as addressed via said Address bus system with a fully biased memory sense amplifier and finally putting said memory data on said external data I/O bus, whereas said memory sense amplifier is normally biased in order to reduce said bias current according to a dynamical bias current control scheme established within said bias regulation unit until the next address change detect signal is furnished by said address transition detection logic and said dynamical bias current control scheme for application within a read cycle operation governed by said "System Clock" signal; the dynamical bias current control scheme being generated so, that the bias current is controlled by said address change detect signal and defined in a time dependent manner reducing after a certain time of said bias current.

2. The circuit according to claim 1 wherein said Sense Electronics Endowed (SEE) memory device is realized using Dynamic-RAM.

3. The circuit according to claim 2 wherein said Dynamic-RAM is manufactured in bipolar technology.

4. The circuit according to claim 2 wherein said Dynamic-RAM is manufactured in CMOS technology.

5. The circuit according to claim 1 wherein said Sense Electronics Endowed (SEE) memory device is realized using Static-RAM.

6. The circuit according to claim 5 wherein said Static-RAM is manufactured in bipolar technology.

7. The circuit according to claim 5 wherein said Static-RAM is manufactured in CMOS technology.

8. The circuit according to claim 1 wherein said Sense Electronics Endowed (SEE) memory device is realized using Flash-memory.

9. The circuit according to claim 1 wherein said Sense Electronics Endowed (SEE) memory device is realized using Magnetic-RAM.

10. The circuit according to claim 1 wherein said Sense Electronics Endowed (SEE) memory device is realized using Ferroelectric-RAM.

11. The circuit according to claim 1 manufactured using modern integrated circuit technologies.

12. The circuit according to claim 1 manufactured as a monolithic integrated circuit.

13. The circuit according to claim 1 manufactured as integrated circuit in monolithic CMOS technology.

14. A circuit, realizing a Sense Electronics Endowed (SEE) memory device with dynamical biasing of memory sense amplifiers, comprising:
 main data storage means for realizing a Sense Electronics Endowed (SEE) memory device with dynamical biasing of a memory read-out means using a memory read-out means with bias control facility controlled by a "System Clock" signal and having external Address and Data I/O bus system connections;
 memory read-out means with read data input and output as well as a bias current control input, whereby said bias current control input is delivered from a bias regulation means;
 bias regulation means with address change detect signal input generating a time dependent bias current control output signal; and
 address transition detection means delivering said address change detect signal for said bias regulation means, whereby said address change detect signal is generated from an address being altered on said external Address bus system, then causing the reading of memory data from a memory address location as addressed via said Address bus system with a fully biased memory read-out means and finally putting said memory data on said external data I/O bus, whereas said memory read-out means is normally biased in order to reduce said bias current according to a dynamical bias current control scheme established within said bias regulation means until the next address change detect signal is furnished by said address transition detection means and said dynamical bias current control scheme for application within a read cycle operation governed by said "System Clock" signal; the dynamical bias current control scheme being generated so, that the bias current is controlled by said address change detect signal and defined in a time dependent manner reducing after a certain time of said bias current.

15. The circuit according to claim 14 wherein said main data storage means is realized as Dynamic-RAM.

16. The circuit according to claim 15 wherein said Dynamic-RAM is manufactured in bipolar technology.

17. The circuit according to claim 15 wherein said Dynamic-RAM is manufactured in CMOS technology.

18. The circuit according to claim 14 wherein said main data storage means is realized as Static-RAM.

19. The circuit according to claim 18 wherein said Static-RAM is manufactured in bipolar technology.

20. The circuit according to claim 18 wherein said Static-RAM is manufactured in CMOS technology.

21. The circuit according to claim 14 wherein said main data storage means is realized as Flash-memory.

22. The circuit according to claim 14 wherein said main data storage means is realized as Magnetic-RAM.

23. The circuit according to claim 14 wherein said main data storage means is realized as Ferroelectric-RAM.

24. The circuit according to claim 14 wherein said memory read-out means is a sense amplifier for memory read-out.

25. The circuit according to claim 14 manufactured using modern integrated circuit technologies.

26. The circuit according to claim 14 manufactured as a monolithic integrated circuit.

27. The circuit according to claim 14 manufactured as integrated circuit in monolithic CMOS technology.

28. A method for implementing a Sense Electronics Endowed (SEE) memory device with dynamical biasing of memory read-out means, comprising:
 providing a main data storage means using an SMR-mode read cycle operation for main data storage with internal "Mem Address", "Mem read/enable" signals, and internal "Mem Data out" data needed within a memory read cycle, controlled by a "System Clock" signal and having external Address bus and Data I/O bus systems;
 providing a main data storage means for realizing a Sense Electronics Endowed (SEE) memory device with dynamical biasing of a memory read-out means using a memory read-out means with bias control facility controlled by a "System Clock" signal and having external Address and Data I/O bus system connections;
 providing said memory read-out means with read data input and output as well as a bias current control input, whereby said bias current control input is delivered from a bias regulation means;
 providing said bias regulation means with address change detect signal input generating a time dependent bias current control output signal;
 providing an address transition detection means delivering said address change detect signal for said bias regulation means;

generating a dynamical bias current control scheme for application within a read cycle operation governed by said "System Clock" signal, whereby said bias current is controlled by said address change detect signal and defined in a time dependent manner in such a way, that after a certain time said bias current is reduced;

detecting within said address transition means said address change detect signal from an address being altered on said external Address bus system;

reading memory data from a memory address location within said main data storage means as addressed via said Address bus system with a fully biased memory read-out means and put said memory data on said external data I/O bus; and biasing said memory read-out means in order to reduce said bias current according to said dynamical bias current control scheme established within said bias regulation means until the next address change detect signal is furnished by said address transition detection means.

29. The method according to claim 28 wherein said main data storage means is realized as Dynamic-RAM.

30. The method according to claim 28 wherein said main data storage means is realized as Static-RAM.

31. The method according to claim 28 wherein said main data storage means is realized as Flash-memory.

32. The method according to claim 28 wherein said main data storage means is realized as Magnetic-RAM.

33. The method according to claim 28 wherein said main data storage means is realized as Ferroelectric-RAM.

34. A method implementing a Sense Electronics Endowed (SEE) memory device with dynamical biasing of memory sense amplifiers, comprising:

providing a memory array for realizing an SEE-memory device with dynamical biasing of memory sense amplifiers using a sense amplifier with bias current control facility controlled by a "System Clock" signal and having external Address and Data I/O bus system connections;

providing said sense amplifier with read data input and output as well as a bias current control input, whereby said bias current control input is delivered from a bias regulation unit;

providing said bias regulation unit with address change detect signal input generating a time dependent bias current control output signal;

providing an address transition detection logic delivering said address change detect signal for said bias regulation unit;

generating a dynamical bias current control scheme for application within a read cycle operation governed by said "System Clock" signal, whereby said bias current is controlled by said address change detect signal and defined in a time dependent manner in such a way, that after a certain time said bias current is reduced;

detecting within said address transition logic said address change detect signal from an address being altered on said external Address bus system reading memory data from a memory address location as addressed via said Address bus system with a fully biased memory sense amplifier and put said memory data on said external data I/O bus; and biasing said memory sense amplifier in order to reduce said bias current according to said dynamical bias current control scheme established within said bias regulation unit until the next address change detect signal is furnished by said address transition detection logic.

* * * * *